United States Patent
Oogi et al.

(10) Patent No.: US 7,750,324 B2
(45) Date of Patent: Jul. 6, 2010

(54) CHARGED PARTICLE BEAM LITHOGRAPHY APPARATUS AND CHARGED PARTICLE BEAM LITHOGRAPHY METHOD

(75) Inventors: Susumu Oogi, Kanagawa (JP); Hitoshi Higurashi, Kanagawa (JP); Akihito Anpo, Tokyo (JP); Toshiro Yamamoto, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 153 days.

(21) Appl. No.: 12/204,382

(22) Filed: Sep. 4, 2008

(65) Prior Publication Data

US 2009/0057575 A1 Mar. 5, 2009

(30) Foreign Application Priority Data

Sep. 5, 2007 (JP) ............................. 2007-229853

(51) Int. Cl.
*G21K 5/10* (2006.01)
*G21K 5/00* (2006.01)
*H01J 37/08* (2006.01)

(52) U.S. Cl. .................... 250/492.22; 250/492.21; 250/492.23

(58) Field of Classification Search .................. 250/306, 250/307, 492.1, 492.2, 492.3, 492.21, 492.22, 250/492.23
See application file for complete search history.

(56) References Cited

U.S. PATENT DOCUMENTS

| | | | |
|---|---|---|---|
| 5,863,682 A * | 1/1999 | Abe et al. ..................... 430/30 |
| 6,541,784 B1 * | 4/2003 | Kawano et al. .......... 250/492.3 |
| 7,495,243 B2 * | 2/2009 | Kamikubo ............. 250/492.22 |
| 7,657,863 B2 * | 2/2010 | Iijima et al. .................... 716/21 |
| 2007/0170374 A1 * | 7/2007 | Iijima et al. .............. 250/492.2 |
| 2008/0073574 A1 * | 3/2008 | Kamikubo ................ 250/492.2 |

FOREIGN PATENT DOCUMENTS

JP 2005-195787 7/2005

* cited by examiner

*Primary Examiner*—Bernard E Souw
(74) *Attorney, Agent, or Firm*—Oblon, Spivak, McClelland, Maier & Neustadt, L.L.P.

(57) ABSTRACT

A charged particle beam lithography apparatus includes a first block area divider configured to divide a pattern forming area into a plurality of first block areas in order to make a number of shots when forming a pattern substantially equal; an area density calculator configured to calculate, using a plurality of small areas obtained by virtually dividing the pattern forming area into mesh areas of a predetermined size smaller than all of the first block areas, a pattern area density of each small area positioned therein for each of the first block areas; a second block area divider configured to re-divide the pattern forming area divided into the plurality of first block areas into a plurality of second block areas of a uniform size, which is larger than the small area; a corrected dose calculator configured to calculate, using the pattern area density of each small area, a proximity effect-corrected dose in each corresponding small area positioned inside the second block area for each of the second block areas; a beam dose calculator configured to calculate, using the proximity effect-corrected dose of each small area, a beam dose of a charged particle beam in each corresponding small area; and a pattern generator configured to form a predetermined pattern on a target object by irradiating a charged particle beam of the beam dose calculated for each of the small areas.

10 Claims, 5 Drawing Sheets

CHARGED PARTICLE BEAM LITHOGRAPHY APPARATUS AND CHARGED PARTICLE BEAM LITHOGRAPHY METHOD

CROSS-REFERENCE TO RELATED APPLICATION

This application is based upon and claims the benefit of priority from prior Japanese Patent Application No. 2007-229853 filed on Sep. 5, 2007 in Japan, the entire contents of which are incorporated herein by reference.

BACKGROUND OF THE INVENTION

1. Field of the Invention

The present invention relates to a charged particle beam lithography apparatus and a charged particle beam lithography method and, for example, relates to a charged particle beam writing apparatus and a charged particle beam writing method for correcting dimension variations due to a proximity effect.

2. Related Art

Lithography technology in charge of development of more microscopic semiconductor devices is an extremely important process among semiconductor manufacturing processes that solely generates patterns. In recent years, with increasingly higher integration of LSI, a circuit linewidth demanded for semiconductor devices is becoming finer year after year. To form a desired circuit pattern on such semiconductor devices, a high-precision original pattern (also called a reticle or mask) is needed. Here, electron beam lithography technology has essentially an excellent resolution and is used for production of high-precision original patterns.

FIG. 7 is a conceptual diagram illustrating the operation of a variable-shaped electron beam writing apparatus. The variable-shaped electron beam (EB) writing apparatus operates as described below. First, a first aperture plate 410 has an oblong opening, for example, a rectangular opening 411 for shaping an electron beam 330 formed therein. A second aperture plate 420 has a variable-shaped opening 421 for shaping the electron beam 330 that passed through the opening 411 into a desired oblong shape shaped therein. The electron beam 330 that passed through the opening 411 after being irradiated from a charged particle source 430 is deflected by a deflector. Then, the electron beam 330 passes through a portion of the variable-shaped opening 421 before being irradiated on a target object placed on a stage. The stage continuously moves in a predetermined direction (for example, the X direction) when writing a pattern. An oblong shape that can pass through both the opening 411 and the variable-shaped opening 421 in this manner is formed in a pattern writing area of a target object 340. A method of forming an optional shape by passing an electron beam through both the opening 411 and the variable-shaped opening 421 is called a variable-shaped method.

In the electron beam pattern writing described above, more precise linewidth uniformity in a target object plane, for example, in a mask plane. Here, if, in the electron beam pattern forming, a circuit pattern is formed by irradiating a mask to which a resist is applied with an electron beam, a phenomenon called a proximity effect caused by back scattering after an electron beam passes through a resist layer to reach a layer thereunder and then reenters the resist layer may occur. Accordingly, dimension variations in which dimensions deviating from desired dimensions are formed when forming a pattern may occur.

To correct the proximity effect, a whole circuit pattern is divided into small blocks of proximity effect measuring 0.5 µm per side to create a map of influenceability. Then, techniques that can suitably form a circuit pattern of determined area density of 50% and calculate a dose for forming a pattern using a dose (fixed value), a proximity effect influenceability α map, and a proximity effect correction coefficient η map are disclosed by documents (See Published Unexamined Japanese Patent Application No. 2005-195787 (JP-A-2005-195787), for example).

In conventional proximity effect correction calculation, a chip area is divided into calculation areas (blocks) of the same size to perform a correction calculation for each block. For the calculation for each block, the block is further divided into small mesh areas. Also, a pattern area density map that defines a pattern area density obtained by cumulatively adding areas of internal figures cut out by small areas is created for each block. Then, the pattern area density map is used for the proximity effect correction calculation.

Here, the calculation time of pattern area density calculation is proportional to the number of shots. Thus, there is a problem that calculations cannot be performed efficiently due to variations in calculation time for each block because the number of shots varies from block to block of the same size. Therefore, the calculation time for each block can be made substantially equal by changing the size of block so that the number of shots contained in each block becomes substantially equal.

On the other hand, the calculation time of proximity effect correction calculation is proportional to the number of small mesh areas. Thus, the calculation time becomes longer in areas of larger block size and shorter in areas of smaller block size. Therefore, there is a problem that if the block size is made non-uniform for the calculation of pattern area density, the proximity effect correction calculation cannot be performed efficiently due to variations in calculation time for each block. Thus, giving priority to one results in a problem for the other.

BRIEF SUMMARY OF THE INVENTION

An object of the present invention is to provide a lithography apparatus and a lithography method capable of performing a pattern area density calculation and a proximity effect correction calculation efficiently.

A charged particle beam lithography apparatus by in one aspect of the present invention includes: a first block area divider configured to divide a pattern forming area into a plurality of first block areas in order to make a number of shots when forming a pattern substantially equal; an area density calculator configured to calculate, using a plurality of small areas obtained by virtually dividing the pattern forming area into mesh areas of a predetermined size smaller than all of the first block areas, a pattern area density of each small area positioned therein for each of the first block areas; a second block area divider configured to re-divide the pattern forming area divided into the plurality of first block areas into a plurality of second block areas of a uniform size, which is larger than the small area; a corrected dose calculator configured to calculate, using the pattern area density of each small area, a proximity effect-corrected dose in each corresponding small area positioned inside the second block area for each of the second block areas; a beam dose calculator configured to calculate, using the proximity effect-corrected dose of each small area, a beam dose of a charged particle beam in each corresponding small area; and a pattern generator configured to form a predetermined pattern on a target object by irradiating a charged particle beam of the beam dose calculated for each of the small areas.

A charged particle beam lithography method in one aspect of the present invention includes: dividing a pattern forming area into a plurality of first block areas in order to make a number of shots when forming a pattern substantially equal; calculating, using a plurality of small areas obtained by virtually dividing the pattern forming area into mesh areas of a predetermined size smaller than all of the first block areas, a pattern area density of each small area positioned therein for each of the first block areas; re-dividing the pattern forming area divided into the plurality of first block areas into a plurality of second block areas of a uniform size, which is larger than the small area; calculating, using the pattern area density of each small area, a proximity effect-corrected dose in each corresponding small area positioned inside the second block area for each of the second block areas; calculating, using the proximity effect-corrected dose of each small area, a beam dose of a charged particle beam in each corresponding small area; and forming a predetermined pattern on a target object by irradiating a charged particle beam of the beam dose calculated for each of the small areas.

DETAILED DESCRIPTION OF THE INVENTION

In an embodiment that follows, the configuration using an electron beam will be described as an example of charged particle beam. However, the charged particle beam is not limited to the electron beam and may be a beam using other charged particles such as an ion beam.

First Embodiment

Figure 1:
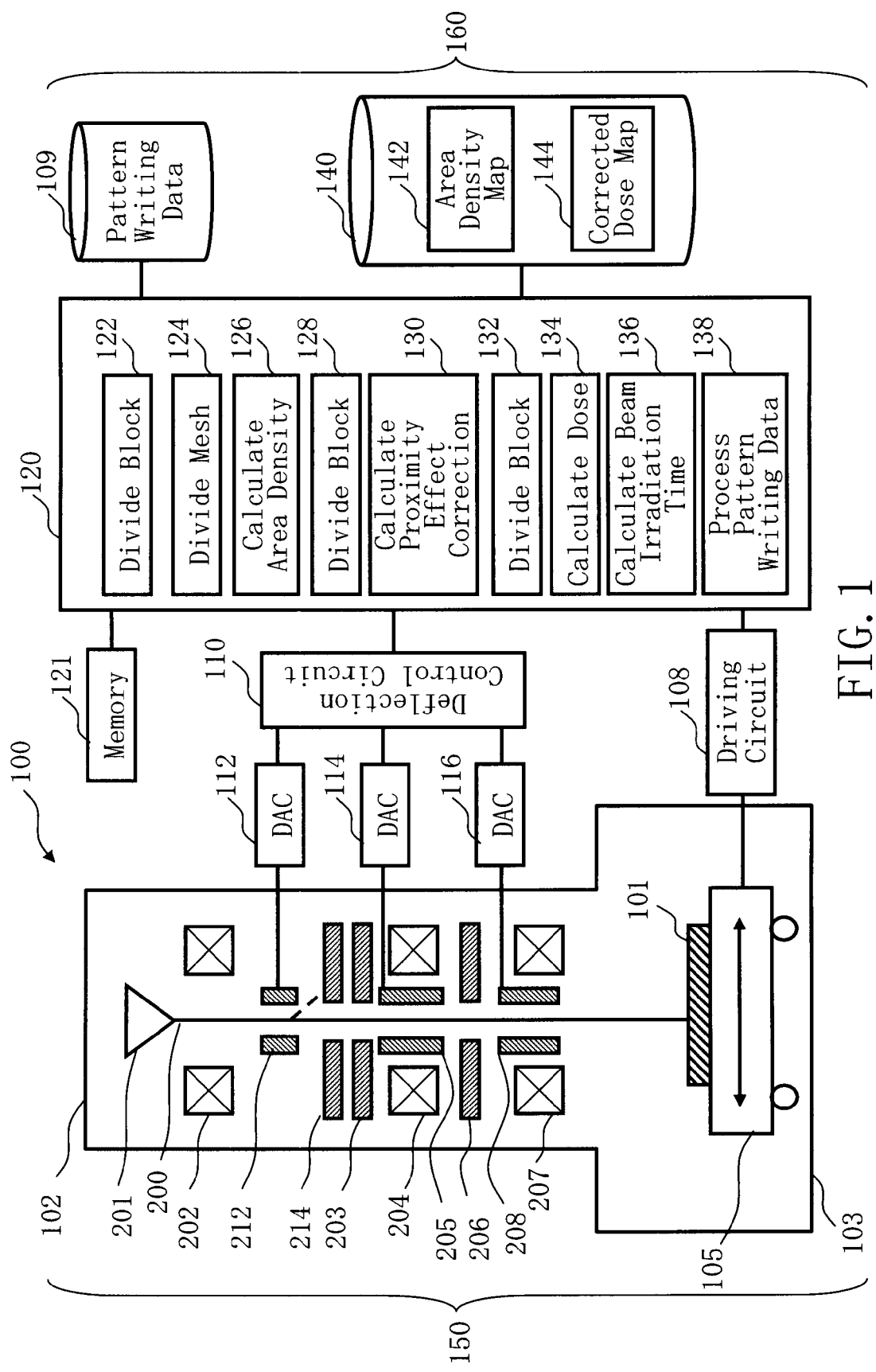
FIG. 1 is a conceptual diagram showing the configuration of a writing apparatus in a first embodiment.

FIG. 1 is a conceptual diagram showing the configuration of a writing apparatus in the first embodiment. In FIG. 1, a writing apparatus 100 includes a writing unit 150, which is an example of pattern generator, and a controller 160. The writing apparatus 100 is an example of charged particle beam lithography apparatus. Then, the writing apparatus 100 forms (or "writes" or "draws") a desired pattern on a target object 101 (or "target workpiece 101") by using EB lithography technique. The pattern writing unit 150 has an electron lens barrel 102 and a pattern writing chamber 103. In the electron lens barrel 102, an electron gun assembly 201, an illumination lens 202, a blanking (BLK) deflector 212, a blanking (BLK) aperture plate 214, a first aperture plate 203, a projection lens 204, a deflector 205, a second aperture plate 206, an objective lens 207, and a deflector 208 are arranged. An XY stage 105 movably arranged is arranged inside the pattern writing chamber 103. The target object 101 is arranged on the XY stage 105. The target object 101 includes, for example, an exposure mask substrate for transferring a pattern to a wafer. The mask substrate includes mask blanks on which no pattern is formed. The controller 160 has a driving circuit 108, magnetic disk drives 109 and 140, a deflection control circuit 110, digital-analog converters (DAC) 112, 114 and 116, a control computer 120, and a memory 121. The control computer 120 internally has such functions as block area dividers 122, 128 and 132, a mesh divider 124, an area density calculator 126, a proximity effect correction calculator 130 which is an example of corrected dose calculator, a dose calculator 134 which is an example of beam dose calculator, a beam irradiation time calculator 136, and a pattern writing data processor 138. Pattern forming data stored in the magnetic disk drive 109 is input to the control computer 120. Information input to the control computer 120 or each piece of information during and after operation processing is each time stored in the memory 121.

The memory 121, the deflection control circuit 110, and the magnetic disk drives 109 and 140 are connected to the control computer 120 via a bus (not shown). The deflection control circuit 110 is connected to the DAC 112, 114 and 116. The DAC 112 is connected to the BLK deflector 212. The DAC 114 is connected to the deflector 205. The DAC 116 is connected to the deflector 208.

In FIG. 1, components required to describe the first embodiment are shown. It is needless to say that other components normally required for the writing apparatus 100 are included. Also, in FIG. 1, processing of various functions such as the block area dividers 122, 128 and 132, the mesh divider 124, the area density calculator 126, the proximity effect correction calculator 130, the dose calculator 134, the beam irradiation time calculator 136, and the pattern writing data processor 138 is shown to be performed by the control computer 120 acting as a computer, but the present invention is not limited to this. For example, hardware of electric circuits may be caused to perform the processing. Or, a combination of hardware of electric circuits and software may be caused to perform the processing. Alternatively, a combination of such hardware and firmware may be used.

An electron beam 200 is irradiated from the electron gun assembly 201, which is an example of irradiation part. The electron beam 200 emitted from the electron gun assembly 201 illuminates the whole first aperture plate 203 having an oblong hole, for example, a rectangular hole by the illumination lens 202. Here, the electron beam 200 is first shaped (or "formed") into an oblong shape, for example a rectangular shape. Then, the electron beam 200 of a first aperture image after passing through the first aperture plate 203 is projected onto the second aperture plate 206 by the projection lens 204. The position of the first aperture image on the second aperture plate 206 is controlled to deflect by the deflector 205 so that the beam shape and dimensions can be changed. As a result, the electron beam 200 is shaped (or "formed"). Then, the electron beam 200 of a second aperture image after passing through the second aperture plate 206 is focused by the objective lens 207 and deflected by the deflector 208. As a result, the electron beam 200 is irradiated at a desired position of the target object 101 on the XY stage 105 moving continuously. Movement of the XY stage 105 is driven by the driving circuit 108. The deflecting voltage of the deflector 205 is controlled by the deflection control circuit 110 and the DAC 114. The deflecting voltage of the deflector 208 is controlled by the deflection control circuit 110 and the DAC 116.

Here, when a beam irradiation time t necessary to provide a desired dose to the target object 101 passes, blanking is performed as described below: to prevent irradiation of the target object 101 with the electron beam 200 more than necessary, for example, the electron beam 200 is deflected by the electrostatic BLK deflector 212 and also the electron beam 200 is cut off by the BLK aperture plate 214. The electron beam 200 is thereby prevented from reaching the surface of the target object 101. The deflecting voltage of the BLK deflector 212 is controlled by the deflection control circuit 110 and the DAC 112.

When a beam is turned on (blanking off), the electron beam 200 emitted from the electron gun assembly 201 follows a path shown as a solid line in FIG. 1. When a beam is turned off (blanking on), on the other hand, the electron beam 200 emitted from the electron gun assembly 201 follows a path shown as a dotted line in FIG. 1. The electron lens barrel 102 and the pattern writing chamber 103 are evacuated by a vacuum pump (not shown) so that a vacuum atmosphere, which is lower than atmospheric pressure, prevails therein.

Here, the inventors found that both calculations can be made efficient by taking a plurality of blocks having non-uniform sizes as a calculation area so that the number of shots becomes substantially equal when calculating a pattern area density and taking a plurality of blocks having uniform sizes as a calculation area when calculating an amount of proximity effect correction. A writing method by a more efficient calculation technique will be described below.

Figure 2:
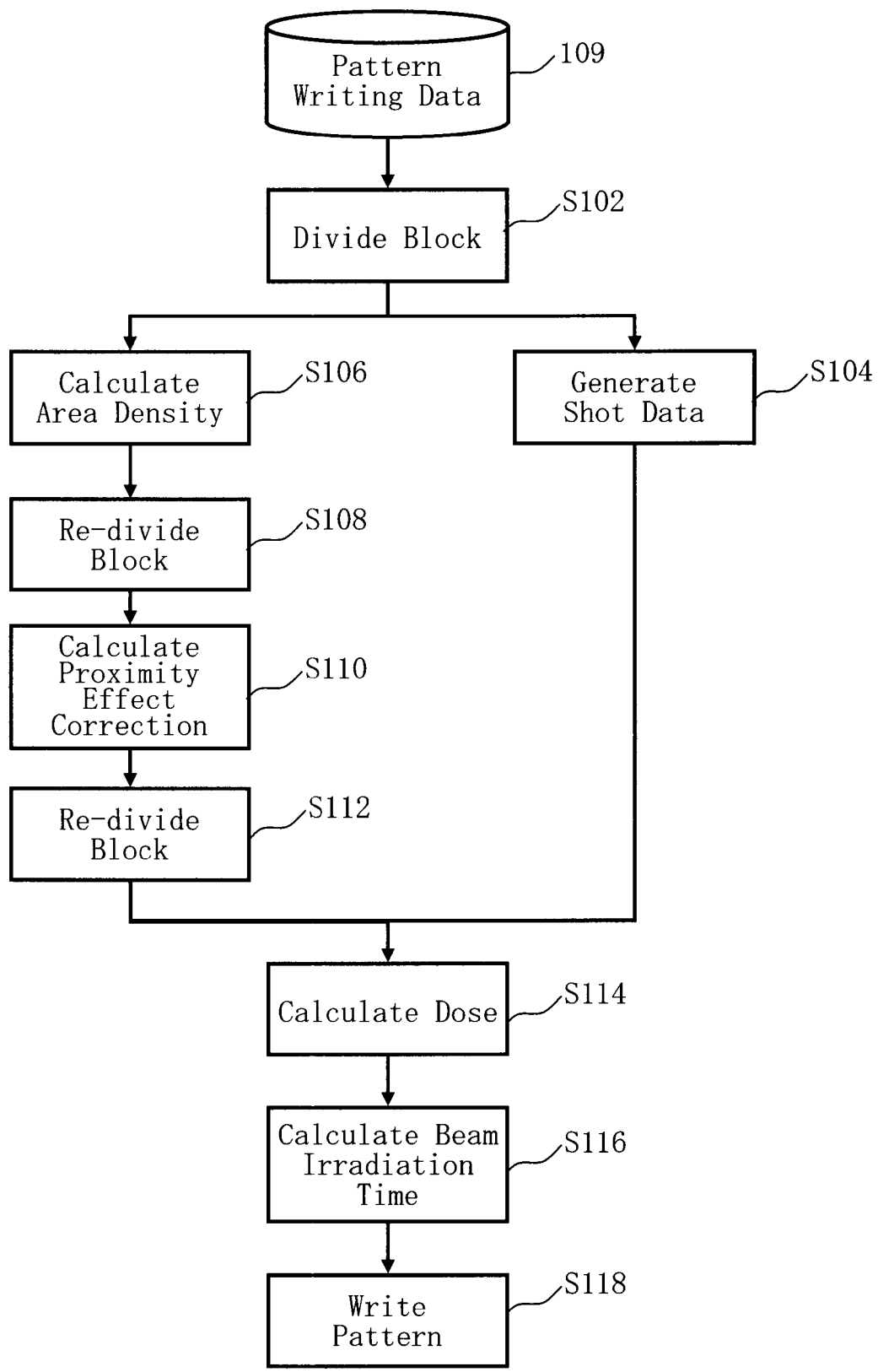
FIG. 2 is a flow chart showing principal processes of a writing method in the first embodiment.

FIG. 2 is a flow chart showing principal processes of the writing method in the first embodiment. First, the control computer 120 reads pattern forming data from the magnetic disk drive 109. Then, operations as shown below using the pattern forming data are performed at each step.

At S (step) 102, as a block division process, the block area divider 122 (first block area divider) divides a pattern writing area (pattern forming area) into a plurality of block areas (first block areas) of non-uniform sizes so that the number of shots when a pattern is formed becomes substantially the same.

Figure 3:
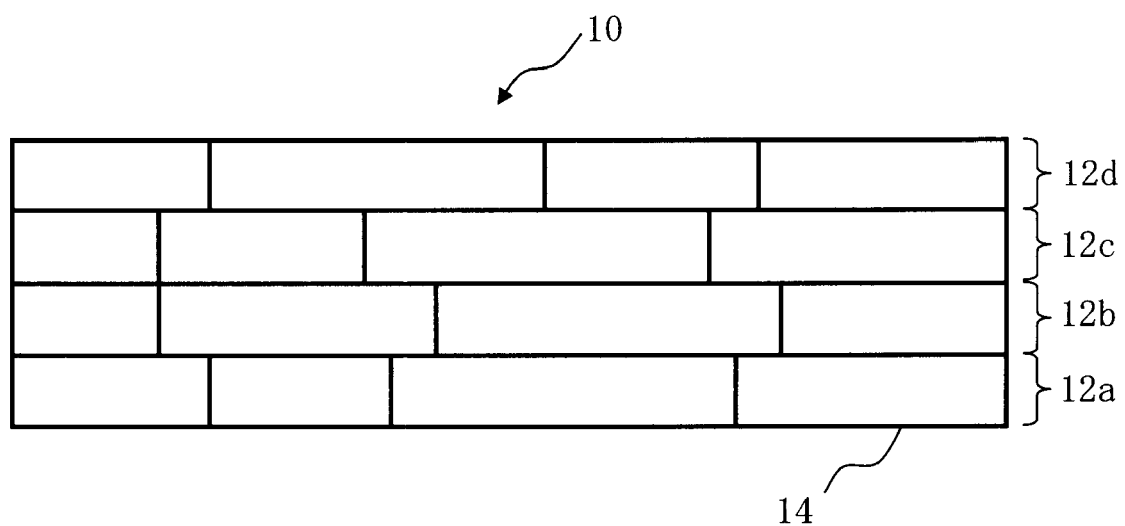
FIG. 3 is a diagram showing an example of block areas mutually having substantially the same number of shots in the first embodiment.

FIG. 3 is a diagram showing an example of block areas mutually having substantially the same number of shots in the first embodiment. In FIG. 3, a chip area 10 to be a pattern writing area is first virtually divided into strip frame areas 12 (also called stripe areas). Each frame area 12 is divided by a width deflectable by the deflector 208. Then, each frame area 12 is divided into areas of non-uniform sizes so that the number of shots when a pattern is formed becomes substantially the same in each area. Each area obtained by being divided into non-uniform sizes will be a block area 14. Here, in FIG. 3, each frame area 12 is divided only in the longitudinal direction when being divided into the block areas 14, but the present invention is not limited to this and each frame area 12 may further be divided in a shorter direction.

At S104, as a shot data generation process, the pattern writing data processor 138 converts pattern forming data into shot data in an apparatus internal format. The conversion is performed for each block area 14.

Also, the chip area 10 is virtually divided by the mesh divider 124 into a plurality of mesh-shaped small areas of a predetermined size smaller than any of the plurality of block areas 14.

Figure 4:
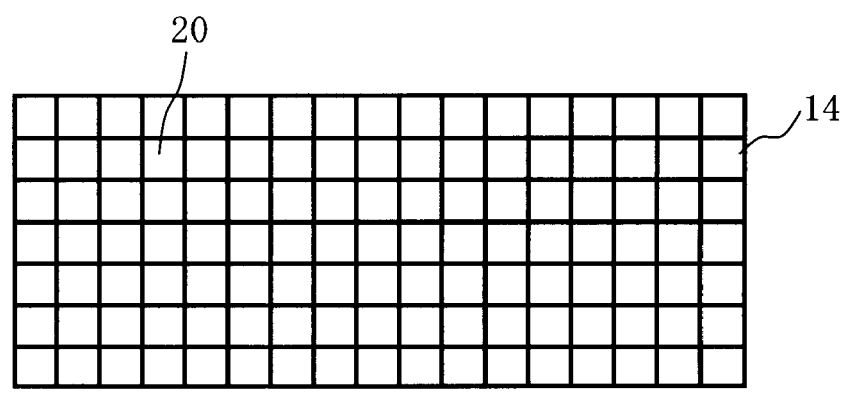
FIG. 4 is a diagram showing an example of some block areas mutually having substantially the same number of shots in the first embodiment being mesh-divided.

FIG. 4 is a diagram showing an example of some block areas mutually having substantially the same number of shots in the first embodiment being mesh-divided. The chip area 10 is divided into a plurality of mesh-shaped small areas 20. In FIG. 4, the optional block area 14 of the chip area 10 is shown.

The mesh size is preferably 1 and 10 or less of the range of influence of proximity effect σ. For example, the chip area 10 is suitably mesh-divided into grid dimensions of the width of 1 μm or less vertically and horizontally.

At S106, as an area density calculation process, the area density calculator 126 uses the plurality of small areas 20 to calculate a pattern area density ρ (x, y) of each small area 20 positioned inside for each block area 14. Here, the area density calculator 126 internally performs distributed processing for each block area 14. Coordinates (x, y) are defined, for example, by the position of the small area 20 from a base position of the block area 14. However, the present invention is not limited to this and coordinates (x, y) may also be defined by the position of the small area 20 from a base position of the chip area 10. Alternatively, other positions may be taken as a base position. The pattern area density ρ (x, y) can be shown to be a value obtained by dividing a cumulatively added value of areas of figures positioned inside the small area 20 by the area of the corresponding small area 20. The calculation time can be made substantially equal among the block areas 14 because the block areas 14 mutually having substantially the same number of shots are used. Then, the area density calculator 126 uses the calculated pattern area density ρ (x, y) to create a pattern area density map 142 defined at the position of the small area 20. Then, the pattern area density map 142 is stored in the magnetic disk drive 140. However, the calculation time among the block areas 14 cannot be made substantially equal if a proximity effect correction calculation is directly made and thus, a process as described below is performed.

At S108, as a block area re-division process, the block area divider 128 (second block area divider) re-divides the chip area 10 divided into the plurality of block areas 14 into a plurality of block areas 16 (second block areas) of a uniform size, which is larger than that of the small area 20. For example, the chip area 10 divided into a size larger than the frame width.

Figure 5:
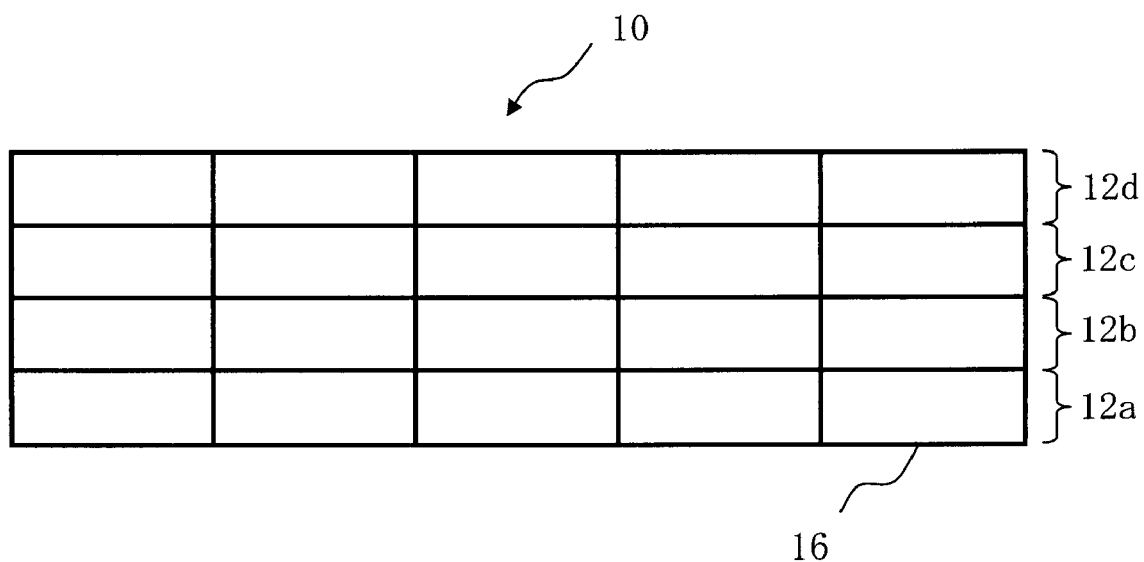
FIG. 5 is a diagram showing an example of block areas of a uniform size in the first embodiment.

FIG. 5 is a diagram showing an example of block areas of a uniform size in the first embodiment. In FIG. 5, as described above, the chip area 10 to be a pattern writing area is virtually divided into strip frame areas 12. Then, each frame area 12 is divided into areas of a uniform size. Each area obtained by being divided into uniform sizes will be the block area 16. Here, in FIG. 5, each frame area 12 is divided only in the longitudinal direction when being divided into the block areas 16, but the present invention is not limited to this and each frame area 12 may further be divided in the shorter direction.

Figure 6:
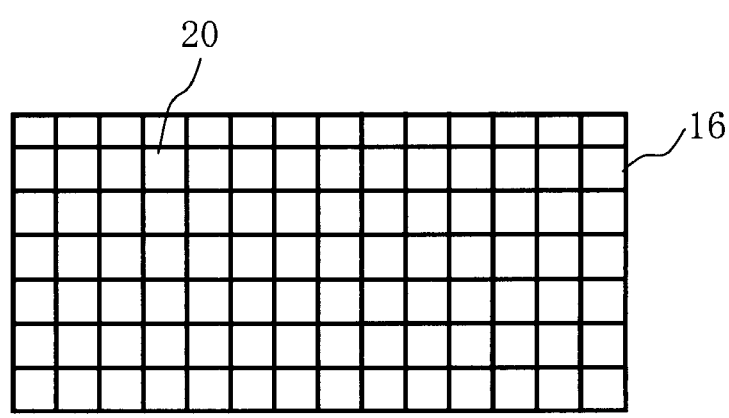
FIG. 6 is a diagram showing an example of block areas of the uniform size in the first embodiment being mesh-divided.
Figure 7:
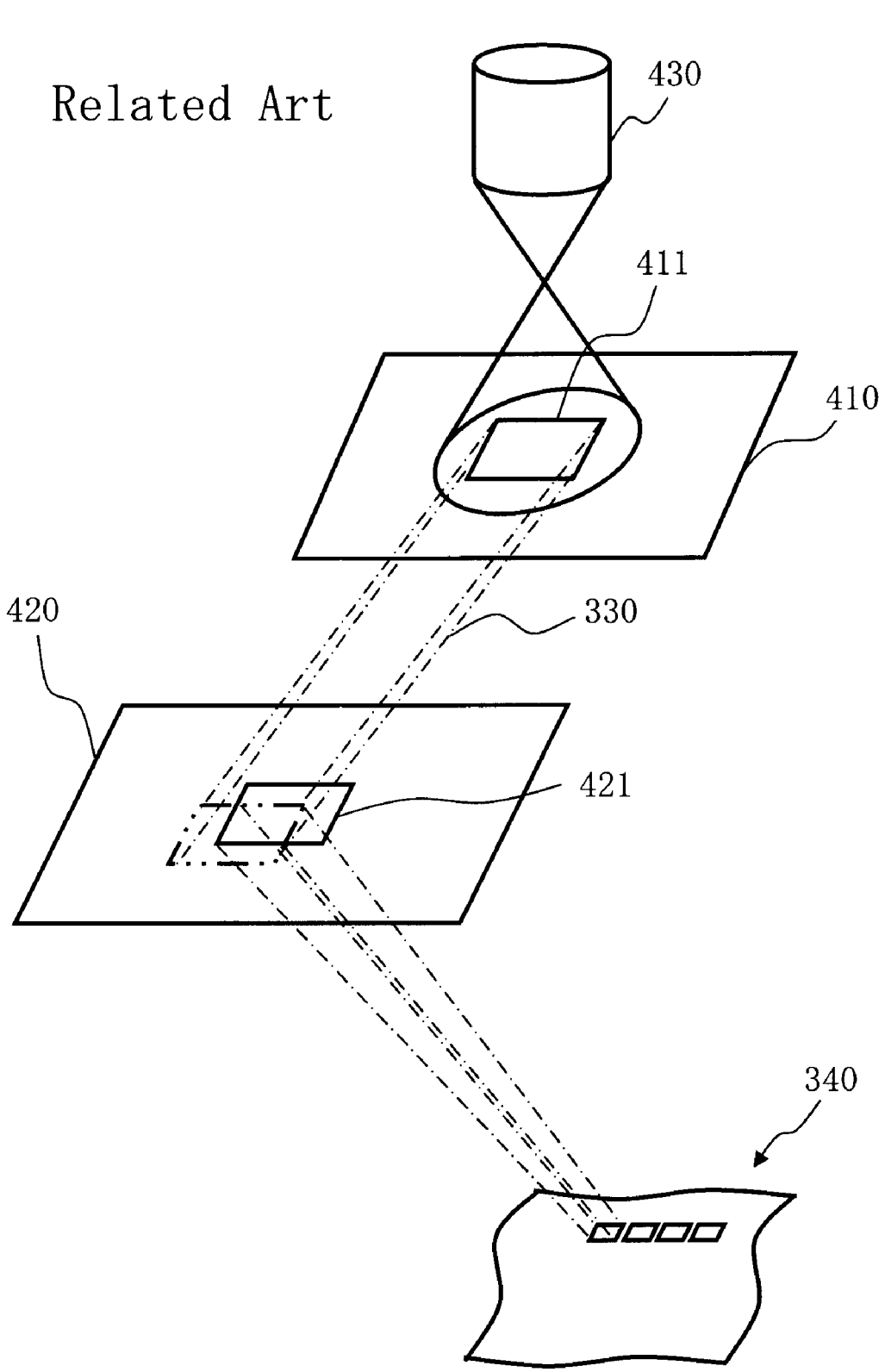
FIG. 7 is a conceptual diagram illustrating the operation of a conventional variable-shaped electron beam writing apparatus.

FIG. 6 is a diagram showing an example of block areas of the uniform size in the first embodiment being mesh-divided. The chip area 10 is already divided into the plurality of mesh-shaped small areas 20 and the plurality of small areas 20 is also applied here. In FIG. 6, the optional block area 16 of the chip area 10 is shown.

At S110, as a proximity effect correction calculation process, the proximity effect correction calculator 130 (corrected dose calculator) calculates a proximity effect-corrected dose Dp (x, y) in each small area 20 positioned inside the block area 16 for each block area 16 using the pattern area density ρ (x, y) of the corresponding small area 20. Here, the proximity effect correction calculator 130 internally performs distributed processing for each block area 16. (x, y) here is defined, for example, as the position of the small area 20 from a base position of the block area 16. However, the present invention is not limited to this and (x, y) may also be defined by the position of the small area 20 from the base position of the chip area 10. Alternatively, other positions may be taken as a base position. The proximity effect correction calculator 130 reads the pattern area density map 142 from the magnetic disk drive 140. Then, the pattern area density ρ (x, y) of the corresponding small area 20 can be referenced from the pattern area density map 142. The proximity effect-corrected dose Dp can be determined from the following equation (1):

$$D_p(x, y) = \frac{\frac{1}{2} + \eta}{\frac{1}{2} + \eta \int \rho(x, y) g(x - x', y - y') dx' dy'} \quad (1)$$

Here, g (x, y) is a kernel function of a variation amount resulting from the proximity effect. As shown by the equation (1), the proximity effect-corrected dose Dp can be defined as a value obtained by multiplying a convolution calculated value of the pattern area density ρ function and the kernel function by a coefficient using the proximity effect correction coefficient η. The kernel function here is a function representing the spread of a proximity effect amount and, for example, the Gaussian function can suitably be used. The calculation time among the block areas 16 can be made substantially equal because the block areas 16 of a uniform size are used. Then, the proximity effect correction calculator 130 uses the calculated proximity effect-corrected dose Dp (x, y) to create a proximity effect-corrected dose map 144 defined at the position of the small area 20. Then, the proximity effect-corrected dose map 144 is stored in the magnetic disk drive 140.

At S112, as a block area re-division process, the block area divider 132 (third block area divider) re-divides the chip area 10 divided into the plurality of block areas 16 into the original plurality of block areas 14. Shot data is defined for the block area 14 while coordinates of the proximity effect-corrected dose map 144 are defined from the base position of the block area 16 and thus, it is inconvenient to maintain consistency between the proximity effect-corrected dose Dp (x, y) and shot data. It can be made easier to maintain consistency by re-dividing the chip area 10 into the original plurality of block areas 14 to unify the coordinate system. The chip area 10 is re-divided here to improve convenience, but the present invention is not limited to this and the block area 16 may be maintained unchanged.

At S114, as a beam dose calculation process, the dose calculator 134 (beam dose calculator) calculates a beam dose D (x, y) of the electron beam 200 in each small area 20 using the proximity effect-corrected dose Dp (x, y) of the corresponding small area 20. The dose calculator 134 reads the proximity effect-corrected dose map 144 from the magnetic disk drive 140. Then, the proximity effect-corrected dose Dp (x, y) of the corresponding small area 20 can be referenced from the proximity effect-corrected dose map 144. In this manner, the beam dose D (x, y) is calculated using the proximity effect-corrected dose Dp (x, y) of each small area 20 positioned inside the block area 14. The beam dose D (x, y) can be calculated by the following equation (2) using a reference dose $D_0$.

$$D(x, y) = Dp(x, y) \times D_0 \quad (2)$$

At S116, as a beam irradiation time calculation process, the beam irradiation time calculator 136 calculates a beam irradiation time t (=dose D (x, y)/current density J) for each small area 20 using the obtained dose D (x, y) and a set current density J.

At S118, as a pattern writing process, the control computer 120 outputs a signal to the deflection control circuit 110 so that beam irradiation to the target object 101 is turned off after the determined beam irradiation time t. Then, the deflection control circuit 110 controls the BLK deflector 212 so that the electron beam 200 is deflected suiting to the determined beam irradiation time t. Then, after the desired dose D (x, y) is provided to the target object 101, the electron beam 200 deflected by the BLK deflector 212 is shielded by the BLK aperture plate 214 so that the electron beam 200 should not reach the target object 101. In this manner, the pattern writing unit 150 irradiates the electron beam 200 of the beam dose of calculated for each small area 20. That is, the pattern writing unit 150 provides a beam dose of the electron beam 200 calculated for each small area 20. A predetermined pattern is thereby formed, (or written) on the target object 101.

As described above, the pattern area density calculation and the proximity effect correction calculation use different block areas. The first block areas in which the number of shots is substantially equal are used for the pattern area density calculation. On the other hand, the second block areas of a uniform size are used for the proximity effect correction calculation. Accordingly, calculations can be performed in blocks suitable for each calculation. Thus, even if there are variations in the number of shots, the pattern area density calculation and the proximity effect correction calculation can be performed efficiently. As a result, the pattern area density calculation and the proximity effect correction calculation can each be made substantially equal by avoiding variations in calculation time for each block area. Then, even if the data amount is enormous, such data can be processed at high speed by the writing apparatus 100.

Processing content or operation content of " . . . or/er" or " . . . process" in the above description can be configured by a program executable on a computer. Alternatively, in addition to the program to be software, a combination of hardware and software may also be used. Or, a combination of software and firmware may be used. When configured by a program, the program is recorded in a recording medium such as a magnetic disk drive, a magnetic tape device, an FD, and a ROM (read-only memory). For example, the program is recorded in the magnetic disk drive 140.

The control computer 120 to be a computer may further be connected to a RAM (random access memory), a ROM, or magnetic disk (HD) drive serving as a storage unit, a keyboard (K/B) or a mouse serving as an input means, a monitor or a printer serving as an output means, or an external interface (I/F), FD, DVD, or CD serving as an input and output means via a bus (not shown).

The present embodiment has been described with reference to concrete examples. However, the present invention is not limited to these concrete examples.

While a description of portions that are not directly needed for describing the present invention such as apparatus components and control techniques are omitted, the apparatus components and control techniques that are needed can suitably be selected and used. For example, though a description of components of a controller controlling the writing apparatus 100 is omitted, it is needless to say that needed components of the controller is suitably selected and used.

In addition, all charged particle beam lithography methods and apparatuses having elements of the present invention and whose design can suitably be modified by those skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam lithography apparatus, comprising:
   a first block area divider configured to divide a pattern forming area into a plurality of first block areas in order to make a number of shots when forming a pattern substantially equal;
   an area density calculator configured to calculate, using a plurality of small areas obtained by virtually dividing the pattern forming area into mesh areas of a predetermined size smaller than all of the first block areas, a pattern area density of each small area positioned therein for each of the first block areas;
   a second block area divider configured to re-divide the pattern forming area divided into the plurality of first block areas into a plurality of second block areas of a uniform size, which is larger than the small area;
   a corrected dose calculator configured to calculate, using the pattern area density of each small area, a proximity effect-corrected dose in each corresponding small area positioned inside the second block area for each of the second block areas;
   a beam dose calculator configured to calculate, using the proximity effect-corrected dose of each small area, a beam dose of a charged particle beam in each corresponding small area; and
   a pattern generator configured to form a predetermined pattern on a target object by irradiating a charged particle beam of the beam dose calculated for each of the small areas.

2. The apparatus according to claim 1, further comprising: a third block area divider configured to re-divide the pattern forming area divided into the plurality of second block areas into the plurality of first block areas,
   wherein the beam dose calculator calculates the beam dose using the proximity effect-corrected dose of each small area positioned inside the first block area.

3. The apparatus according to claim 1, wherein the area density calculator creates a pattern area density map for each of the small areas, and
   the corrected dose calculator references the pattern area density of the corresponding small area from the pattern area density map.

4. The apparatus according to claim 1, wherein the corrected dose calculator creates a proximity effect-corrected dose map for each of the small areas, and
   the beam dose calculator references the proximity effect-corrected dose of the corresponding small area from the proximity effect-corrected dose map.

5. The apparatus according to claim 1, wherein the small area has a size of 1 µm or less.

6. The apparatus according to claim 1, wherein the plurality of first block areas is areas obtained by further dividing a plurality of frame areas, which are obtained by dividing the pattern forming area into strip areas.

7. A charged particle beam lithography method, comprising:
   dividing a pattern forming area into a plurality of first block areas in order to make a number of shots when forming a pattern substantially equal;
   calculating, using a plurality of small areas obtained by virtually dividing the pattern forming area into mesh areas of a predetermined size smaller than all of the first block areas, a pattern area density of each small area positioned therein for each of the first block areas;
   re-dividing the pattern forming area divided into the plurality of first block areas into a plurality of second block areas of a uniform size, which is larger than the small area;
   calculating, using the pattern area density of each small area, a proximity effect-corrected dose in each corresponding small area positioned inside the second block area for each of the second block areas;
   calculating, using the proximity effect-corrected dose of each small area, a beam dose of a charged particle beam in each corresponding small area; and
   forming a predetermined pattern on a target object by irradiating a charged particle beam of the beam dose calculated for each of the small areas.

8. The method according to claim 7, further comprising: re-dividing the pattern forming area divided into the plurality of second block areas into the plurality of first block areas,
   Wherein the beam dose is calculated using the proximity effect-corrected dose of each small area positioned inside the first block area.

9. The method according to claim 7, wherein a pattern area density map for each of the small areas is created, and
   the pattern area density of the each small area is referenced from the pattern area density map.

10. The method according to claim 7, wherein a proximity effect-corrected dose map for each of the small areas is created, and
    the proximity effect-corrected dose of the each small area is referenced from the proximity effect-corrected dose map.

* * * * *